US011227762B2

(12) United States Patent
Tanaka

(10) Patent No.: US 11,227,762 B2
(45) Date of Patent: Jan. 18, 2022

(54) SEMICONDUCTOR MANUFACTURING APPARATUS AND SEMICONDUCTOR MANUFACTURING METHOD

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/583,418

(22) Filed: Sep. 26, 2019

(65) Prior Publication Data
US 2020/0135448 A1    Apr. 30, 2020

(30) Foreign Application Priority Data

Oct. 24, 2018    (JP) .............................. JP2018-199718

(51) Int. Cl.
*H01L 21/02* (2006.01)
*B08B 3/10* (2006.01)
(Continued)

(52) U.S. Cl.
CPC .......... *H01L 21/02057* (2013.01); *B08B 3/10* (2013.01); *H01L 21/30604* (2013.01);
(Continued)

(58) Field of Classification Search
None
See application file for complete search history.

(56) References Cited

U.S. PATENT DOCUMENTS

| 2008/0226826 A1* | 9/2008 | Tanaka | H01L 21/6723 |
| | | | 427/299 |
| 2014/0227883 A1* | 8/2014 | Izumoto | H01L 21/67023 |
| | | | 438/745 |

(Continued)

FOREIGN PATENT DOCUMENTS

| JP | 2004074118 A | 3/2004 |
| JP | 2005217226 A | 8/2005 |

(Continued)

OTHER PUBLICATIONS

An Office Action; "Notice of Reasons for Refusal", mailed by the Japanese Patent Office dated Aug. 24, 2021, which corresponds to Japanese Patent Application No. 2018-199718 and is related to U.S. Appl. No. 16/583,418; with English language translation.

*Primary Examiner* — Stephanie P Duclair
(74) *Attorney, Agent, or Firm* — Studebaker & Brackett PC

(57) ABSTRACT

A semiconductor manufacturing apparatus includes a chuck stage, a stage rotation mechanism, a chemical liquid nozzle, a chemical liquid nozzle scan mechanism, a lower surface gas nozzle, a gas temperature controller configured to control a temperature of gas to be supplied to the lower surface gas nozzle, a gas bypass pipe configured to allow the gas to be supplied to the lower surface gas nozzle without causing the gas to pass through the gas temperature controller, and first and second on-off valves configured to open and shut to allow either of the gas whose temperature has been controlled by the gas temperature controller and the gas passing through the gas bypass pipe to be supplied to the lower surface gas nozzle. Actuation of the first and second on-off valves allows a temperature of the gas passing through the lower surface gas nozzle to be changed.

3 Claims, 10 Drawing Sheets

(51) Int. Cl.
*H01L 21/67*     (2006.01)
*H01L 21/306*    (2006.01)
*H01L 21/461*    (2006.01)
*H01L 21/3213*   (2006.01)

(52) U.S. Cl.
CPC ...... *H01L 21/32134* (2013.01); *H01L 21/461* (2013.01); *H01L 21/6708* (2013.01)

(56) References Cited

U.S. PATENT DOCUMENTS

| | | | |
|---|---|---|---|
| 2014/0356539 A1* | 12/2014 | Inatomi | C23C 18/42 427/315 |
| 2015/0060407 A1* | 3/2015 | Negoro | C11D 11/0047 216/92 |
| 2017/0182515 A1* | 6/2017 | Emoto | H01L 21/68792 |

FOREIGN PATENT DOCUMENTS

| | | |
|---|---|---|
| JP | 2007-227764 A | 9/2007 |
| JP | 2013-112843 A | 6/2013 |
| JP | 2015-050350 A | 3/2015 |
| JP | 2015-162486 A | 9/2015 |
| JP | 2017-118064 A | 6/2017 |

* cited by examiner

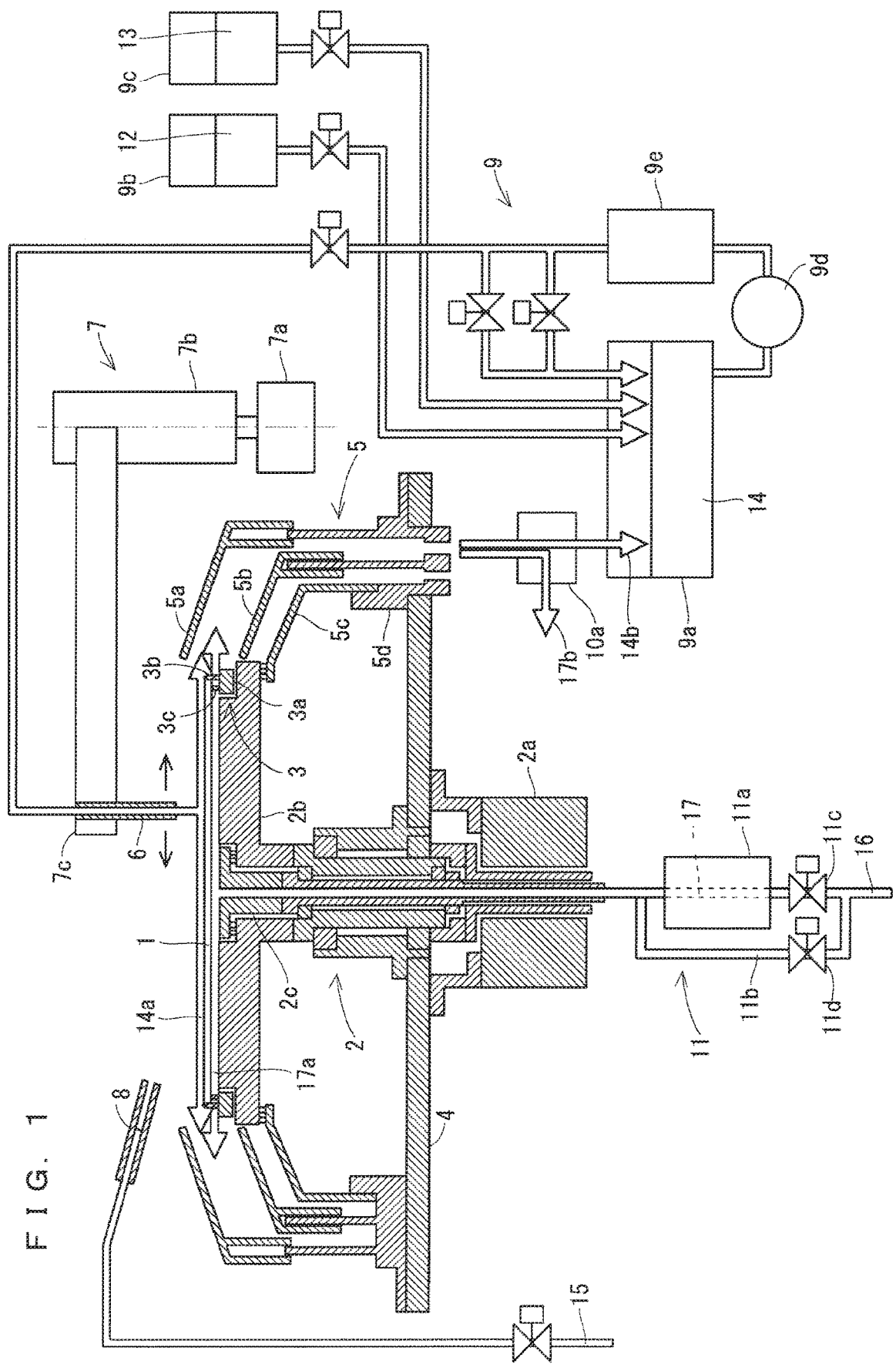
F I G. 1

F I G. 2
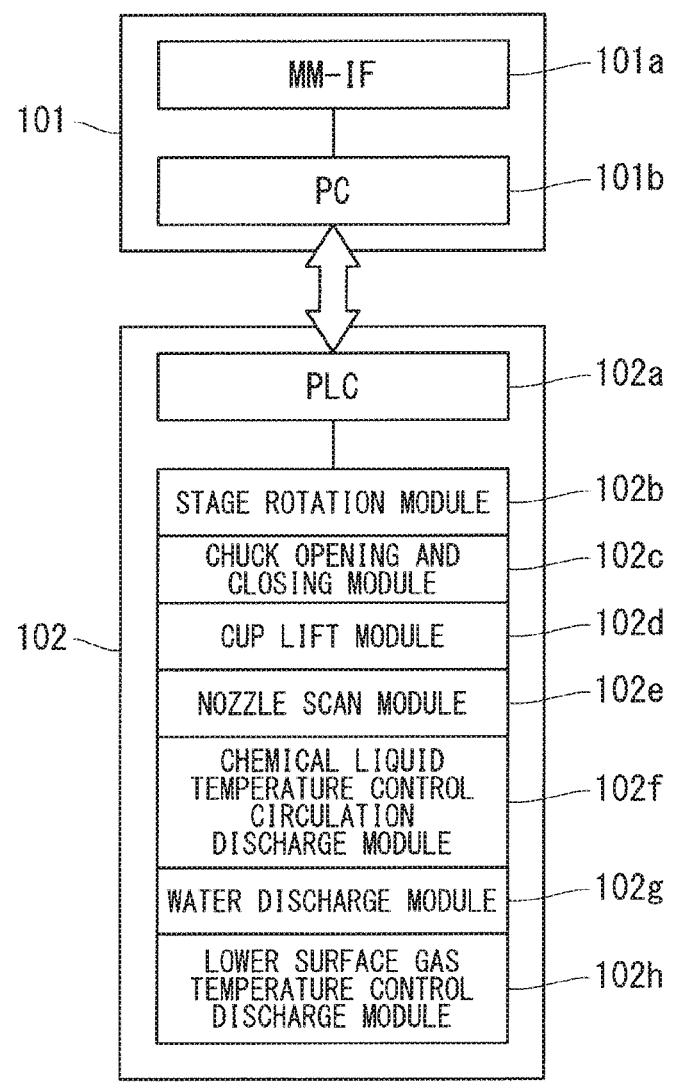

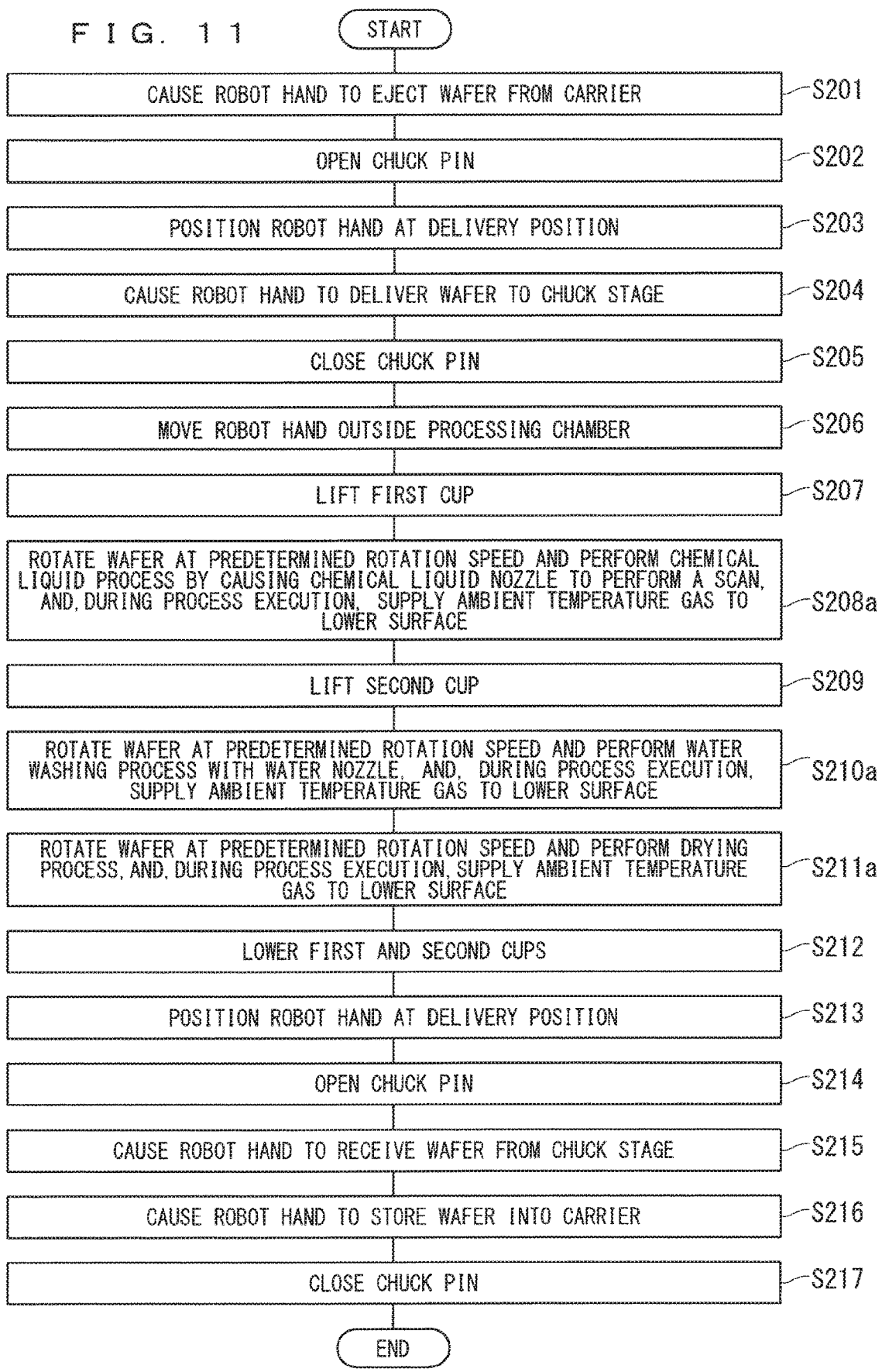

SEMICONDUCTOR MANUFACTURING APPARATUS AND SEMICONDUCTOR MANUFACTURING METHOD

BACKGROUND OF THE INVENTION

Field of the Invention

The present invention relates to a wet processing technique implemented by discharging a chemical liquid to a semiconductor wafer.

Description of the Background Art

In a semiconductor manufacturing process, after a pattern of organic material is formed by lithography using a resist, etching is performed on an oxide film or a metal material by dry etching using several types of gas energized through application of a high-frequency output.

Thereafter, in order to remove the resist, a chemical liquid is used to dissolve the resist. As a method of removing a resist using a chemical liquid, the technique described in Japanese Patent Application Laid-Open No. 2005-217226 is disclosed, for example.

In a conventional general semiconductor manufacturing apparatus, a chemical liquid process is performed by discharging a chemical liquid at a predetermined flow rate while rotating a semiconductor wafer at a predetermined rotation speed and causing a chemical liquid nozzle to perform a scan at a predetermined speed so as to cause the chemical liquid to uniformly spread all over an upper surface of the semiconductor wafer. Hereinafter, the "semiconductor wafer" is simply referred to as a "wafer".

For example, in a reaction-controlled chemical liquid process such as removal of a resist with a sulfuric acid/hydrogen peroxide mixture, in order to shorten a processing time, a temperature of a chemical liquid is increased to make reactivity higher in many cases.

However, as described above, since the chemical liquid is discharged at the predetermined flow rate while the wafer keeps rotating at the predetermined rotation speed and the chemical liquid nozzle keeps performing a scan at the predetermined speed, an atmosphere on the upper surface of the wafer is released while taking heat from the chemical liquid on the upper surface of the wafer. Further, ambient temperature gas supplied from under a lower surface of a chuck stage is released while taking heat from the chemical liquid on the upper surface of the wafer through the wafer that is high in thermal conductivity. The temperature of the chemical liquid on the upper surface of the wafer, particularly, at the periphery of the wafer, drops sharply.

In order to suppress such a drop in the temperature of the chemical liquid, it is effective to increase the discharge flow rate of the chemical liquid and increase the scan speed of the chemical liquid nozzle to widen the scan range. However, when there is a physical limit to a range of an operation condition, the effect is also limited, and as a result, in-plane uniformity in the chemical liquid process is also limited. Further, the increase in the flow rate of the chemical liquid increases the pace of volatilization and decomposition of chemical liquid components contained in the chemical liquid, so that a stock solution to be additionally supplied needs to be increased and is accordingly increased in consumption.

Further, in a supply-controlled chemical liquid process such as etching of an Si wafer with fluoro-nitric acid, it is not sufficient to spread the chemical liquid on the upper surface of the wafer uniformly all over the upper surface of the wafer, and it is necessary to ensure that the chemical liquid is uniformly activated all over the upper surface of the wafer. This requires that operation conditions such as the rotation speed of the wafer, the discharge flow rate of the chemical liquid, the scan speed of the chemical liquid nozzle, and the scan range of the chemical liquid nozzle be optimized. However, when there are physical limits to the ranges of the operation conditions, the optimization also becomes insufficient. In particular, in a case of a chemical liquid process such as etching of an Si wafer with fluoro-nitric acid where reaction heat is generated, it fails to take a measure such as giving rise to, in the area around the center portion of the wafer, a reaction appropriate to a reaction that is liable to occur at the center portion of the wafer and is accelerated or decelerated in accordance with the intensity of activity, and as a result, the in-plane uniformity in the chemical liquid process is also limited.

Further, in the technique described in Japanese Patent Application Laid-Open No. 2005-217226, the wafer is fixed to a mounting table and is directly heated, and temperature unevenness occurs due to poor adhesion between the wafer and the mounting table, which prevents the chemical liquid process from being performed with the temperature uniform all over the wafer, and accordingly makes it difficult to achieve the in-plane uniformity in the chemical liquid process.

SUMMARY

It is an object of the present invention to provide a technique that allows sufficient in-plane uniformity in a chemical liquid process to be ensured even within a range of an operation condition where a physical limit becomes severe due to, for example, an increase in diameter of a wafer.

A semiconductor manufacturing apparatus according to the present invention includes a chuck stage, a stage rotation mechanism, a chemical liquid nozzle, a chemical liquid nozzle scan mechanism, a gas nozzle, a gas temperature controller, a gas bypass pipe, and an on-off valve. The chuck stage holds a wafer using an end portion of the chuck stage. The stage rotation mechanism rotates the chuck stage. The chemical liquid nozzle discharges a chemical liquid to a processing surface of the wafer. The chemical liquid nozzle scan mechanism causes the chemical liquid nozzle to perform a scan on the processing surface of the wafer. The gas nozzle supplies gas to an opposite surface opposed to the processing surface of the wafer. The gas temperature controller controls a temperature of the gas to be supplied to the gas nozzle. The gas bypass pipe allows the gas to be supplied the gas nozzle without causing the gas to pass through the gas temperature controller. The on-off valve opens and shuts to allow either of the gas whose temperature has been controlled by the gas temperature controller and the gas passing through the gas bypass pipe to be supplied to the gas nozzle. Actuation of the on-off valve allows a temperature of the gas passing through the gas nozzle to be changed.

Since the chemical liquid process can be performed with a temperature uniform all over the wafer, in-plane uniformity in the chemical liquid process can be sufficiently ensured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing a chemical liquid process in a processing chamber of a semiconductor manufacturing apparatus according to a first preferred embodiment;

FIG. 2 is a schematic diagram showing a control function of the processing chamber of the semiconductor manufacturing apparatus according to the first preferred embodiment;

FIG. 11 is a flowchart showing processes to be performed in the semiconductor manufacturing apparatus according to the underlying technology.

DESCRIPTION OF THE PREFERRED EMBODIMENTS

Underlying Technology

Figure 9:
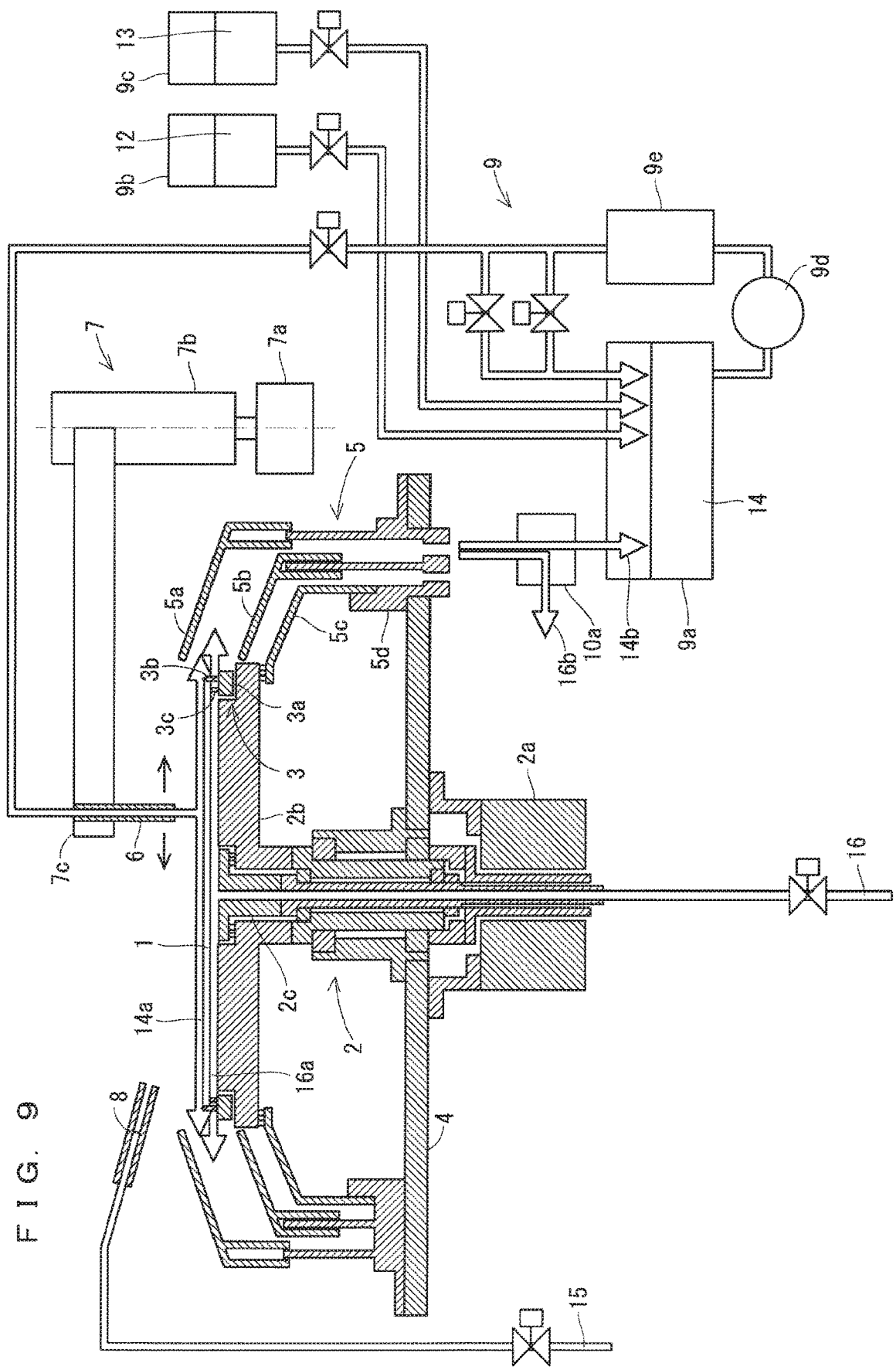
FIG. 9 is a cross-sectional view showing a chemical liquid process in a processing chamber of a semiconductor manufacturing apparatus according to an underlying technology.

Before describing the preferred embodiments of the present invention, a description will be given of a semiconductor manufacturing apparatus according to an underlying technology. FIG. 9 is a cross-sectional view showing a chemical liquid process in a processing chamber of the semiconductor manufacturing apparatus according to the underlying technology.

As shown in FIG. 9, the semiconductor manufacturing apparatus according to the underlying technology includes a stage rotation mechanism 2, a chuck openings and closing mechanism 3, a platen 4, a cup lift mechanism 5, a chemical liquid nozzle 6, a chemical liquid nozzle scan mechanism 7, a water nozzle 8, a chemical liquid temperature control circulation discharge mechanism 9, and a first gas-liquid separator 10a.

The stage rotation mechanism 2 includes a stage rotation motor 2a, a chuck stage 2b, and a lower surface gas nozzle 2c whose discharge port is positioned in alignment with a center portion of a wafer 1. The chuck stage 2b holds the wafer 1 using an end portion of the chuck stage 2b. The stage rotation motor 2a rotates the chuck stage 2b. The lower surface gas nozzle 2c supplies gas to a surface opposed to a processing surface of the wafer 1.

The chuck opening and closing mechanism 3 includes a chuck pin base 3a, a chuck pin 3b, and a support pin 3c. The cup lift mechanism 5 includes a first cup 5a, a second cup 5b, a cover 5c, and a cup base 5d.

The chemical liquid nozzle 6 discharges a chemical liquid 14a to the processing surface of the wafer 1. The chemical liquid nozzle scan mechanism 7 includes a scan motor 7a, a scan shaft 7b, and a scan arm 7c, and causes the chemical liquid nozzle 6 to perform a scan on the processing surface of the wafer 1. The chemical liquid temperature control circulation discharge mechanism 9 includes a chemical liquid circulation tank 9a, a first stock solution tank 9b, a second stock solution tank 9c, a chemical liquid circulation pump 9d, and a chemical liquid temperature controller 9e.

Here, the processing surface of the wafer 1 is an upper surface of the wafer 1. The surface opposed to the processing surface of the wafer 1 is an opposite surface opposed to the processing surface of the wafer 1, and more specifically, a lower surface of the wafer 1.

Figure 10:
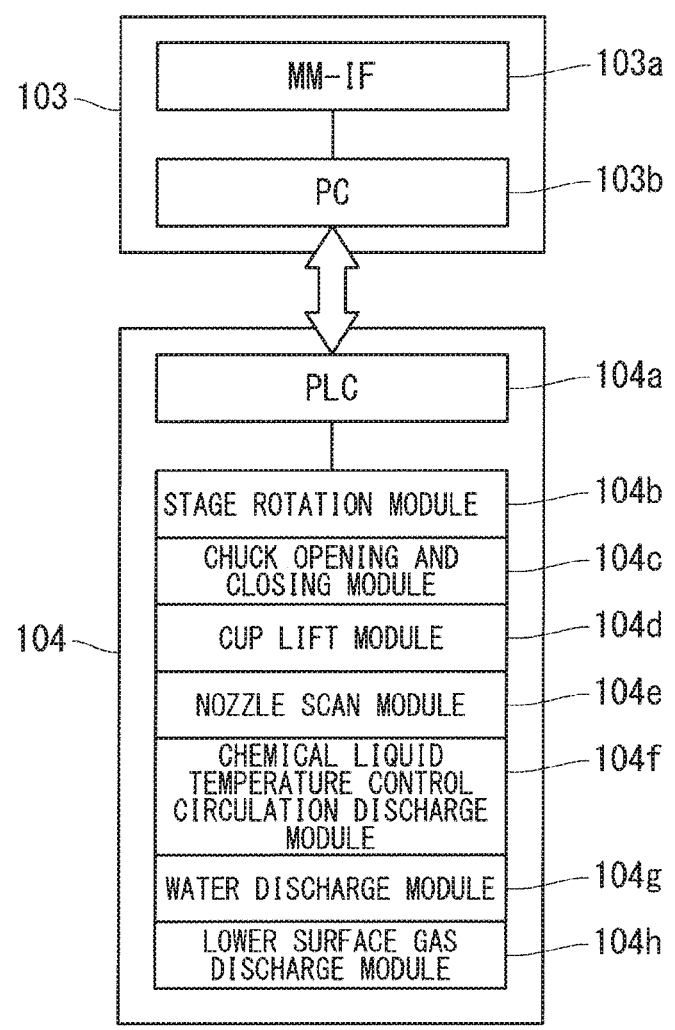
FIG. 10 is a schematic diagram showing a control function of the processing chamber of the semiconductor manufacturing apparatus according to the underlying technology.

FIG. 10 is a schematic diagram showing a control function of the processing chamber of the semiconductor manufacturing apparatus according to the underlying technology. As shown in FIG. 10, an operation PC 103 includes a man machine interface (MM-IF) 103a such as a touch panel display and a personal computer (PC) 103b.

A control PLC 104 includes a programmable logic controller (PLC) 104a, a stage rotation module 104b that controls the stage rotation mechanism 2, a chuck opening and closing module 104c that controls the chuck opening and closing mechanism 3, a cup lift module 104d that controls the cup lift mechanism 5, a nozzle scan module 104e that controls the chemical liquid nozzle scan mechanism 7, a chemical liquid temperature control circulation discharge module 104f that controls the chemical liquid temperature control circulation discharge mechanism 9, a water discharge module 104g that controls a discharge of water 15, and a lower surface gas discharge module 104h that controls a discharge of ambient temperature gas 16 to the lower surface.

An operator sets a carrier (not shown) containing the wafer 1 into a load port (not shown), selects a recipe pre-registered in the PC 103b on the MM-IF I03a, and inputs a process start. The PC 103b passes a processing parameter specified in the recipe to the PLC 104a to start a series of control operations of the PLC 104a. The PLC 104a controls a transfer robot (not shown), the processing chamber, and the like, causes the transfer robot to map wafer loading slots in the carrier and to transfer the wafer 1 between the carrier and the processing chamber, and performs a series of processes on the wafer 1 in the processing chamber.

Next, a description will be given of preparation of a chemical liquid 14 in the chemical liquid temperature control circulation discharge mechanism 9. In this example, a desired chemical liquid 14 is prepared from two stock solutions. A specified amount of first stock solution 12 is supplied from the first stock solution tank 9b to the chemical liquid circulation tank 9a, a specified amount of second stock solution 13 is supplied from the second stock solution tank 9c to the chemical liquid circulation tank 9a, and the chemical liquid circulation pump 9d is actuated to circulate the chemical liquid 14, and the chemical liquid temperature controller 9e controls a temperature of the chemical liquid 14 to a predetermined temperature while the chemical liquid 14 keeps being circulated. When a circulation flow rate and the temperature of the chemical liquid 14 fall within predetermined ranges, the preparation of the chemical liquid 14 is completed. Note that an operation of additionally supplying the first stock solution 12 and the second stock solution 13 to compensate for a decrease in liquid components caused by volatilization, decomposition and reaction, and a decrease in liquid volume due to the use of the chemical liquid 14 is generally performed.

Next, a description will be given of an operation of the processing chamber. Rotating the chuck pin base 3a of the chuck opening and closing mechanism 3 to open and close the chuck pin 3b allows the wafer 1 to be loaded onto the chuck stage 2b of the stage rotation mechanism 2. Causing the stage rotation motor 2a to rotate the chuck stage 2b allows the wafer 1 held by the chuck pins 3b to rotate. The chemical liquid nozzle 6 is attached to the chemical liquid nozzle scan mechanism 7, and the scan motor 7a oscillates to allow the chemical liquid nozzle 6 to perform a scan on the upper surface of the wafer 1 via the scan shaft 7b and the scan arm 7c. The chemical liquid process is performed by discharging the chemical liquid 14 at a predetermined flow rate while rotating the wafer 1 at a predetermined rotation speed and causing the chemical liquid nozzle 6 to perform a scan at a predetermined speed so as to cause the chemical liquid 14a on the upper surface of the wafer 1 to uniformly spread all over the upper surface of the wafer 1.

The rotation of the wafer 1 causes the chemical liquid 14a on the upper surface of the wafer 1 to flow out from the end portion of the wafer 1. However, with the first cup 5a of the cup lift mechanism 5 disposed to surround a periphery of the chuck stage 2b lifted, the chemical liquid 14a becomes a reclaimed chemical liquid 14b and returns to the chemical liquid circulation tank 9a through the first gas-liquid separator 10a.

When the chemical liquid process is completed, the discharge of the chemical liquid 14 is stopped, the chemical liquid nozzle scan mechanism 7 is returned to a standby position, the second cup 5b is lifted, and a water washing process is started. The water washing process is performed by discharging the water 15 from the water nozzle 8 to the center portion of the wafer 1 at a predetermined flow rate while rotating the wafer 1 at a predetermined rotation speed so as to cause the water 15 to uniformly spread all over the upper surface of the wafer 1.

When the water washing process is completed, the discharge of the water 15 is stopped, and a drying process is started. The drying process is performed by rotating the wafer 1 at a predetermined rotation speed to spin-dry the wafer 1.

From the start of the chemical liquid process to the end of the drying process, in order to prevent the chemical liquid 14a and water 15 on the upper surface of the wafer 1 from flowing along the end portion of the wafer 1 to the lower surface due surface tension, the ambient temperature gas 16 keeps being supplied from the lower surface gas nozzle 2c positioned in alignment with a center portion of the chuck stage 2b. Ambient temperature gas 16a on the lower surface of the wafer 1 is exhausted by the cup together with an atmosphere on the upper surface of the wafer 1 and then becomes ambient temperature gas 16b to be released through the first gas-liquid separator 10a.

FIG. 11 is a flowchart showing processes to be performed in the semiconductor manufacturing apparatus according to the underlying technology.

The PLC 104a causes a robot hand of the transfer robot to eject, from the carrier, the wafer 1 stored in the carrier in step S201, and rotates the chuck pin base 3a to open the chuck pin 3b in step S202.

The PLC 104a positions the robot hand at a delivery position over the chuck stage 2b in step S203, and causes the robot hand to deliver the wafer 1 to the chuck stage 2b in step S204.

The PLC 104a rotates the chuck pin base 3a to close the chuck pin 3b in step S205, and moves the robot hand outside the processing chamber in step S206.

The PLC 104a lifts the first cup 5a in step S207, and performs, in step S208a, the chemical liquid process by discharging the chemical liquid 14 at the predetermined flow rate while rotating the wafer 1 at the predetermined rotation speed and causing the chemical liquid nozzle 6 to perform a scan at the predetermined speed so as to cause the chemical liquid 14a on the upper surface of the wafer 1 to uniformly spread all over the upper surface of the wafer 1 as described above. During the execution of the chemical liquid process, in order to prevent the chemical liquid 14a on the upper surface of the wafer 1 from flowing along the end portion of the wafer 1 to the lower surface due to surface tension, the ambient temperature gas 16 keeps being supplied from the lower surface gas nozzle 2c positioned in alignment with the center portion of the chuck stage 2b.

The PLC 104a lifts the second cup 5b in step S209, and performs, in step S210a, the water washing process by discharging the water 15 from the water nozzle 8 to the center portion of the wafer 1 at the predetermined flow rate while rotating the wafer 1 at the predetermined rotation speed so as to cause the water 15 to uniformly spread all over the upper surface of the wafer 1 as described above. During the execution of the water washing process, in order to prevent the water 15 on the upper surface of the wafer 1 from flowing along the end portion of the wafer 1 to the lower surface due to surface tension, the ambient temperature gas 16 keeps being supplied from the lower surface gas nozzle 2c positioned in alignment with the center portion of the chuck stage 2b.

The PLC 104a rotates the wafer 1 at the predetermined rotation speed to spin-dry the wafer 1 in step S211a. During the execution of the spin-drying process, in order to prevent the water 15 on the upper surface of the wafer 1 from flowing along the end portion of the wafer 1 to the lower surface due to surface tension and droplets splashing off the second cup 5b from moving to the lower surface, the ambient temperature gas 16 keeps being supplied from the lower surface gas nozzle 2c positioned in alignment with the center portion of the chuck stage 2b.

The PLC 104a lowers the first cup 5a and the second cup 5b in step S212, positions the robot hand at the delivery position in step S213, and rotates the chuck pin base 3a to open the chuck pin 3b in step S214.

The PLC 104a causes the robot hand to receive the wafer 1 from the chuck stage 2b in step S215, causes the robot hand to store the wafer 1 into the carrier in step S216, and rotates the chuck pin base 3a to close the chuck pin 3b in step S217.

Note that, although the steps have been described roughly sequentially for the purpose of simplification, it is needless to say that segmented operation steps are practically in execution in parallel, and various inputs and outputs related to the operations are in execution.

For example, in a reaction-controlled chemical liquid process such as removal of a resist with a sulfuric acid/hydrogen peroxide mixture, in order to shorten a processing time, a temperature of a chemical liquid is increased to make reactivity higher in many cases. However, since the semiconductor manufacturing apparatus according to the underlying technology is configured as described above, even when the chemical liquid process is performed by discharging the chemical liquid 14 at the predetermined flow rate while rotating the wafer 1 at the predetermined rotation speed and causing the chemical liquid nozzle 6 to perform a scan at the predetermined speed so as to cause the chemical liquid 14a on the upper surface of the wafer 1 to uniformly spread all over the upper surface of the wafer 1, the atmosphere on the upper surface of the wafer 1 is released through the first cup 5a while taking heat from the chemical liquid 14a on the upper surface of the wafer 1. Furthermore, the ambient temperature gas 16 supplied from the lower surface gas nozzle 2c positioned in alignment with the center portion of the chuck stage 2b is released through the first cup 5a while taking heat from the chemical liquid 14a on the upper surface of the wafer 1 through the wafer 1 that is high in thermal conductivity, which results in a sharp drop in the temperature of the chemical liquid 14a on the upper surface of the wafer 1, particularly, at the periphery of the wafer 1.

In order to suppress such a drop in the temperature of the chemical liquid 14a, it is effective to increase the discharge flow rate of the chemical liquid 14 and increase the scan speed of the chemical liquid nozzle 6 to widen the scan range. However, when there is a physical limit to a range of an operation condition, the effect is also limited, and as a result, in-plane uniformity in the chemical liquid process is also limited. Further, the increase in the flow rate of the chemical liquid 14 increases the pace of volatilization and decomposition of chemical liquid components contained in the chemical liquid 14, so that the stock solution to be additionally supplied needs to be increased and is accordingly increased in consumption.

Further, in a supply-controlled chemical liquid process such as etching of an Si wafer with fluoro-nitric acid, it is not sufficient to spread the chemical liquid 14a on the upper surface of the wafer 1 uniformly all over the upper surface of the wafer 1, and it is necessary to ensure that the chemical liquid 14a is uniformly activated all over the upper surface of the wafer 1. This requires that operation conditions such as the rotation speed of the wafer 1, the discharge flow rate of the chemical liquid 14, the scan speed of the chemical liquid nozzle 6, and the scan range of the chemical liquid nozzle 6 be optimized. However, when there are physical limits to the ranges of the operation conditions, the optimization also becomes insufficient, and particularly in a case of a chemical liquid process such as etching of an Si wafer with fluoro-nitric acid where reaction heat is generated, the semiconductor manufacturing apparatus according to the underlying technology configured as described above fails to take a measure such as giving rise to, in an area around the center portion of the wafer 1, a reaction appropriate to a reaction that is liable to occur at the center portion of the wafer 1 and is accelerated or decelerated in accordance with the intensity of activity, and as a result, the in-plane uniformity in the chemical liquid process is limited. The preferred embodiments of the present invention to be described below solve such problems.

First Preferred Embodiment

A description will be given of a first preferred embodiment of the present invention with reference to the drawings. Note that, in the first preferred embodiment, the same components as those described in the underlying technology are denoted by the same reference numerals, and descriptions thereof will be omitted. FIG. 1 is a cross-sectional view showing a chemical liquid process in a processing chamber of a semiconductor manufacturing apparatus according to the first preferred embodiment.

As shown in FIG. 1, the semiconductor manufacturing apparatus according to the first preferred embodiment further includes a lower surface gas temperature control discharge mechanism 11 in addition to the components of the semiconductor manufacturing apparatus according to the underlying technology shown in FIG. 9. The configuration of the semiconductor manufacturing apparatus according to the first preferred embodiment is substantially the same as the configuration according to the underlying technology except for the lower surface gas temperature control discharge mechanism 11, and thus a description will be given of the lower surface gas temperature control discharge mechanism 11 here.

The lower surface gas temperature control discharge mechanism 11 includes a gas temperature controller 11a, a gas bypass pipe 11b, a first on-off valve 11c, and a second on-off valve 11d.

The gas temperature controller 11a controls a temperature of ambient temperature gas 16 to supply temperature-controlled gas 17 to a lower surface gas nozzle 2c. The gas bypass pipe 11b is a pipe that allows the ambient temperature gas 16 to be supplied to the lower surface gas nozzle 2c without causing the ambient temperature gas 16 to pass through the gas temperature controller 11a.

The first on-off valve 11c and the second on-off valve 11d are on-off valves that opens and shuts to allow either of the temperature-controlled gas 17 whose temperature has been controlled by the gas temperature controller 11a and the ambient temperature gas 16 passing through the gas bypass pipe 11b to be supplied to the lower surface gas nozzle 2c.

The first on-off valve 11c is disposed adjacent to an inlet of the gas temperature controller 11a, and the second on-off valve 11d is disposed in the middle of the gas bypass pipe 11b. Opening the first on-off valve 11c and shutting the second on-off valve 11d causes the ambient temperature gas 16 to be temperature-controlled by the gas temperature controller 11a and then become the temperature-controlled gas 17, and the temperature-controlled gas 17 is supplied to the lower surface gas nozzle 2c. In this case, the ambient temperature gas 16 does not pass through the gas bypass pipe 11 b.

On the other hand, shutting the first on-off valve 11c and opening the second on-off valve 11d causes the ambient temperature gas 16 to be supplied to the lower surface gas nozzle 2c through the gas bypass pipe 11b. In this case, the ambient temperature gas 16 does not pass through the gas temperature controller 11a. As described above, the gas passing through the lower surface gas nozzle 2c can be switched between the temperature-controlled gas 17 and the ambient temperature gas 16 through the actuation of the first on-off valve 11c and the second on-off valve 11d, and it goes without saying that a set temperature of the temperature-controlled gas 17 can be changed in accordance with a recipe, thereby making it possible to change the temperature as desired. Such an operation is a temperature control process of changing the temperature of gas to be supplied.

FIG. 2 is a schematic diagram showing a control function of the processing chamber. As shown in FIG. 2, an operation PC 101 includes a man machine interface (MM-IF) 101a such as a touch panel display and a personal computer (PC) 101b. A control PLC 102 includes a programmable logic controller (PLC) 102a, a stage rotation module 102b that controls a stage rotation mechanism 2, a chuck opening and closing module 102c that controls a chuck opening and closing mechanism 3, a cup lift module 102d that controls a cup lift mechanism 5, a nozzle scan module 102e that controls a chemical liquid nozzle scan mechanism 7, a chemical liquid temperature control circulation discharge module 102f that controls a chemical liquid temperature control circulation discharge mechanism 9, a water discharge module 102g that controls a discharge of water 15, and a lower surface gas temperature control discharge module 102h that controls the lower surface gas temperature control discharge mechanism 11.

An operator sets a carrier (not shown) containing a wafer 1 in a load port (not shown), selects a recipe pre-registered in the PC 101b on the MM-IF 101a, and inputs a process start. The PC 101b passes a processing parameter specified in the recipe to the PLC 102a to start a series of control operations of the PLC 102a. The PLC 102a controls a transfer robot (not shown), the processing chamber, and the like, causes the transfer robot to map wafer loading slots in the carrier and to transfer the wafer 1 between the carrier and the processing chamber, and performs a series of processes on the wafer 1 in the processing chamber.

Next, a description will be given of preparation of a chemical liquid 14 in the chemical liquid temperature control circulation discharge mechanism 9. In this example, a desired chemical liquid 14 is prepared from two stock solutions. A specified amount of first stock solution 12 is supplied from a first stock solution tank 9b to a chemical liquid circulation tank 9a, and a specified amount of second stock solution 13 is supplied from a second stock solution tank 9c to a chemical liquid circulation tank 9a. A chemical liquid circulation pump 9d is actuated to circulate the chemical liquid 14, and a chemical liquid temperature controller 9e controls a temperature of the chemical liquid 14 to a predetermined temperature while the chemical liquid 14 keeps being circulated. When a circulation flow rate and the temperature of the chemical liquid 14 fall within predetermined ranges, the preparation of the chemical liquid 14 is completed. Note that an operation of additionally supplying the first stock solution 12 and the second stock solution 13 to compensate for a decrease in liquid components caused by volatilization, decomposition and reaction, and a decrease in liquid volume due to the use of the chemical liquid 14 is generally performed.

Next, a description will be given of an operation of the processing chamber. Rotating a chuck pin base 3a of the chuck opening and closing mechanism 3 to open and close a chuck pin 3b allows the wafer 1 to be loaded onto a chuck stage 2b of the stage rotation mechanism 2. Causing a stage rotation motor 2a to rotate the chuck stage 2b allows the wafer 1 held by the chuck pins 3b to rotate. A chemical liquid nozzle 6 is attached to the chemical liquid nozzle scan mechanism 7, and a scan motor 7a oscillates to allow the chemical liquid nozzle 6 to perform a scan on an upper surface of the wafer 1 via a scan shaft 7b and a scan arm 7c. The chemical liquid process is performed by discharging the chemical liquid 14 at a predetermined flow rate while rotating the wafer 1 at a predetermined rotation speed and causing the chemical liquid nozzle 6 to perform a scan at a predetermined speed so as to cause a chemical liquid 14a on the upper surface of the wafer 1 to uniformly spread all over the upper surface of the wafer 1.

Although the rotation of the wafer 1 causes the chemical liquid 14a on the upper surface of the wafer 1 to flow out from an end portion of the wafer 1, with a first cup 5a of the cup lift mechanism 5 disposed to surround a periphery of the chuck stage 2b lifted, the chemical liquid 14a becomes a reclaimed chemical liquid 14b and returns to the chemical liquid circulation tank 9a through a first gas-liquid separator 10a.

During the execution of the chemical liquid process, in order to prevent the chemical liquid 14a on the upper surface of the wafer 1 from flowing along the end portion of the wafer 1 to a lower surface due to surface tension and further to suppress a temperature change in an area around a center portion of the wafer 1, the temperature-controlled gas 17 whose temperature has been controlled by the gas temperature controller 11a to a predetermined temperature appropriate to the chemical liquid temperature is supplied from the lower surface gas nozzle 2c positioned in alignment with the center portion of the chuck stage 2b. This makes it possible to ensure sufficient in-plane uniformity in the chemical liquid process. Temperature-controlled gas 17a on the lower surface of the wafer 1 is exhausted by the first cup 5a together with an atmosphere on the upper surface of the wafer 1 and then becomes temperature-controlled gas 17b to be released through the first gas-liquid separator 10a.

When the chemical liquid process is completed, the discharge of the chemical liquid 14 is stopped, the chemical liquid nozzle scan mechanism 7 is returned to a standby position, a second cup 5b is lifted, and a water washing process is started.

Figure 3:
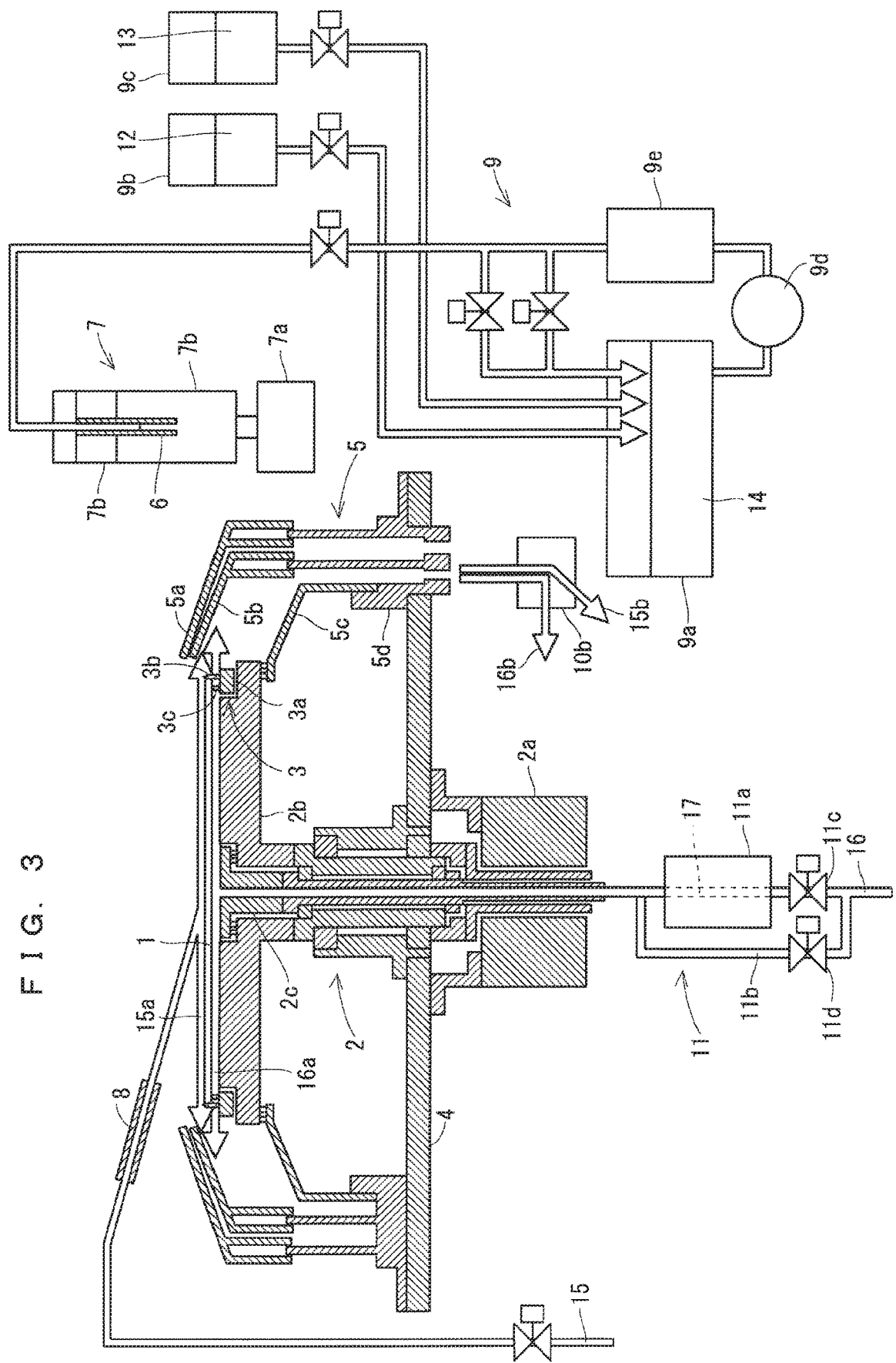
FIG. 3 is a cross-sectional view showing a water washing process in the processing chamber of the semiconductor manufacturing apparatus according to the first preferred embodiment.

FIG. 3 is a cross-sectional view showing the water washing process in the processing chamber. The water washing process is performed by discharging the water 15 from a water nozzle 8 to the center portion of the wafer 1 at a predetermined flow rate while rotating the wafer 1 at a predetermined rotation speed so as to cause the water 15 to uniformly spread all over the upper surface of the wafer 1.

During the execution of the water washing process, in order to prevent water 15a on the upper surface of the wafer 1 from flowing along the end portion of the wafer 1 to the lower surface due to surface tension, the ambient temperature gas 16 passing through the gas bypass pipe 11b is supplied from the lower surface gas nozzle 2c positioned in alignment with the center portion of the chuck stage 2b, but the temperature-controlled gas 17 may be supplied as needed even in the water washing process. Ambient temperature gas 16a on the lower surface of the wafer 1 is exhausted by the second cup 5b together with the atmosphere on the upper surface of the wafer 1 and then becomes ambient temperature gas 16b to be released through a second gas-liquid separator 10b. At this time, water 15b is drained from the second gas-liquid separator 10b. When the water washing process is completed, the discharge of the water 15 is stopped, and a drying process is started.

Figure 4:
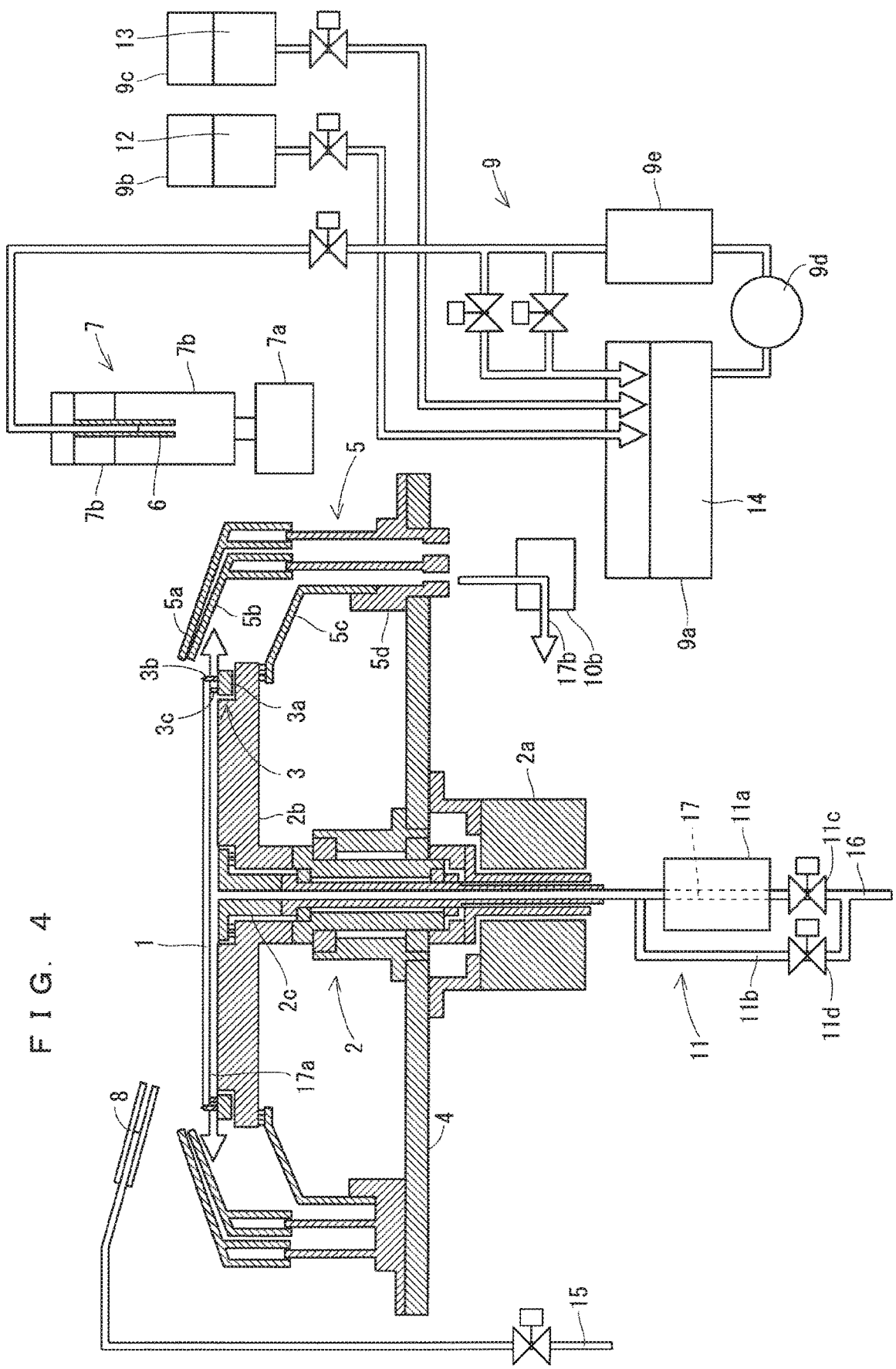
FIG. 4 is a cross-sectional view showing a drying process in the processing chamber of the semiconductor manufacturing apparatus according to the first preferred embodiment.

FIG. 4 is a cross-sectional view showing the drying process in the processing chamber. As shown in FIG. 4, rotating the wafer 1 at a predetermined rotation speed causes the wafer 1 to be spin-dried.

During the execution of the drying process, in order to prevent the water 15a (see FIG. 3) on the upper surface of the wafer 1 from flowing along the end portion of the wafer 1 to the lower surface due to surface tension and droplets splashing off the second cup 5b from moving to the lower surface and to further accelerate the drying of the wafer 1, the temperature-controlled gas 17 whose temperature has been controlled by the gas temperature controller 11a to a predetermined temperature suitable for the drying is supplied from the lower surface gas nozzle 2c positioned in alignment with the center portion of the chuck stage 2b. The supply of the temperature-controlled gas 17 heats the wafer 1. The temperature-controlled gas 17a on the lower surface of the wafer 1 is exhausted by the second cup 5b together with the atmosphere on the upper surface of the wafer 1 and then becomes the temperature-controlled gas 17b to be released through the second gas-liquid separator 10b. For example, the supply of the temperature-controlled gas 17 whose temperature is higher than the ambient temperature allows a drying time to be shortened.

Figure 5:
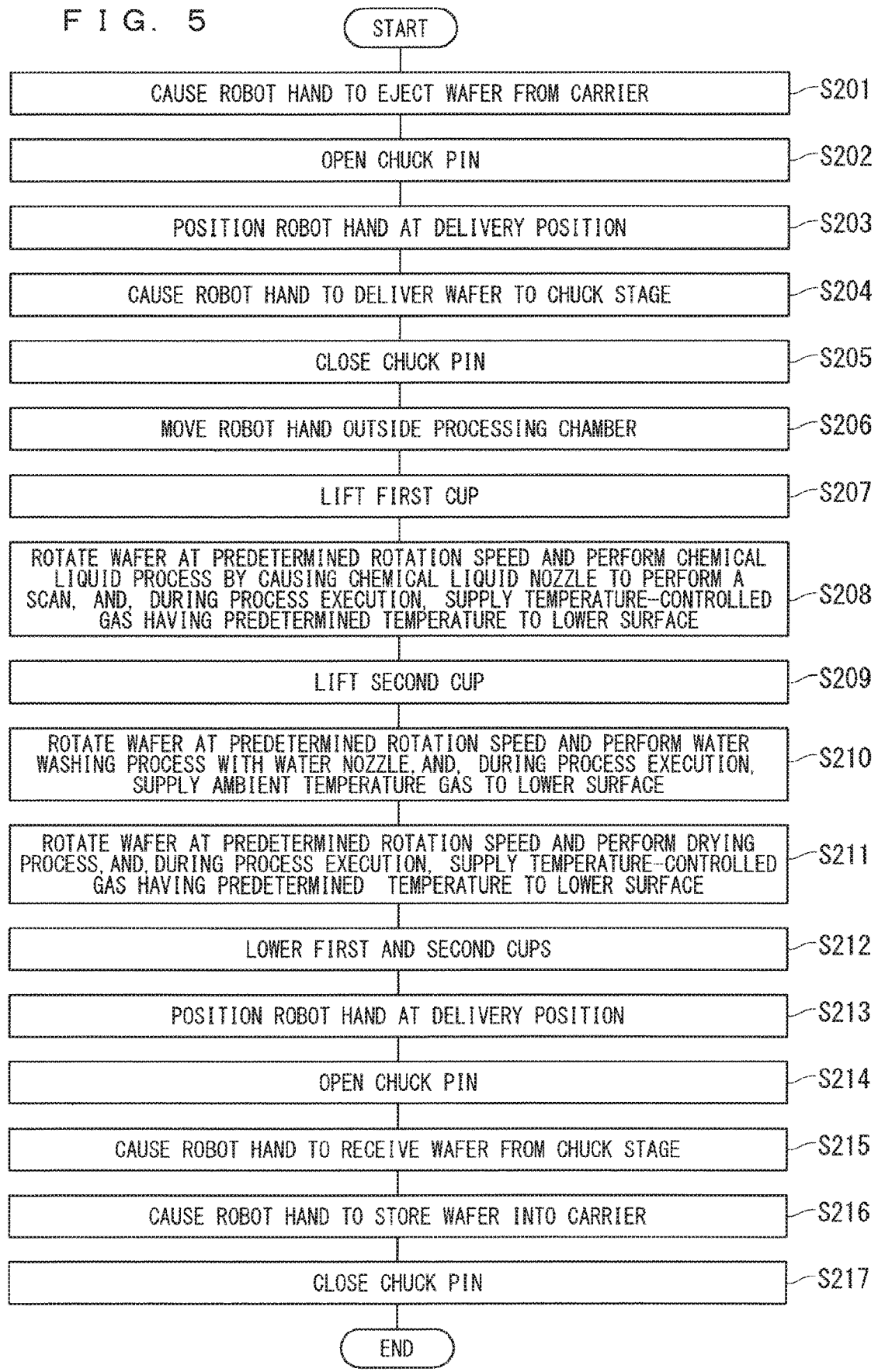
FIG. 5 is a flowchart showing processes to be performed in the semiconductor manufacturing apparatus according to the first preferred embodiment.

FIG. 5 is a flowchart showing processes to be performed in the semiconductor manufacturing apparatus according to the first preferred embodiment.

The PLC 102a causes a robot hand of the transfer robot to eject, from the carrier, the wafer 1 stored in the carrier in step S201, and rotates the chuck pin base 3a to open the chuck pin 3b in step S202.

The PLC 102a positions the robot hand at a delivery position over the chuck stage 2b in step S203, and causes the robot hand to deliver the wafer 1 to the chuck stage 2b in step S204.

The PLC 102a rotates the chuck pin base 3a to close the chuck pin 3b in step S205, moves the robot hand outside the processing chamber in step S206, and lifts the first cup 5a in step S207.

The PLC 102a performs, in step S208, the chemical liquid process by discharging the chemical liquid 14 at the predetermined flow rate while rotating the wafer 1 at the predetermined rotation speed and causing the chemical liquid nozzle 6 to perform a scan at the predetermined speed so as to cause the chemical liquid 14a on the upper surface of the wafer 1 to uniformly spread all over the upper surface of the wafer 1 as described above. During the execution of the chemical liquid process, in order to prevent the chemical liquid 14a on the upper surface of the wafer 1 from flowing along the end portion of the wafer 1 to the lower surface due to surface tension and further to suppress a temperature change in the area around the center portion of the wafer 1, the temperature-controlled gas 17 whose temperature has been controlled by the gas temperature controller 11a to the predetermined temperature appropriate to the chemical liquid temperature is supplied from the lower surface gas nozzle 2c positioned in alignment with the center portion of the chuck stage 2b.

The PLC 102a lifts the second cup 5b in step S209, and performs, in step S210, the water washing process by discharging the water 15 from the water nozzle 8 to the center portion of the wafer 1 at the predetermined flow rate while rotating the wafer 1 at the predetermined rotation speed so as to cause the water 15 to uniformly spread all over the upper surface of the wafer 1 as described above. During the execution of the water washing process, in order to prevent water 15a on the upper surface of the wafer 1 from flowing along the end portion of the wafer 1 to the lower surface due to surface tension, the ambient temperature gas 16 passing through the gas bypass pipe 11b is supplied from the lower surface gas nozzle 2c positioned in alignment with the center portion of the chuck stage 2b, but the temperature-controlled gas 17 may be supplied as needed even in the water washing process.

The PLC 102a rotates the wafer 1 at the predetermined rotation speed to spin-dry the wafer 1 in step S211. During the execution of the drying process, in order to prevent the water 15a on the upper surface of the wafer 1 from flowing along the end portion of the wafer 1 to the lower surface due to surface tension and droplets splashing off the second cup 5b from moving to the lower surface and to further accelerate the drying of the wafer 1, the temperature-controlled gas 17 whose temperature has been controlled by the gas temperature controller 11a to the predetermined temperature suitable for the drying is supplied from the lower surface gas nozzle 2c positioned in alignment with the center portion of the chuck stage 2b.

The PLC 102a lowers the first cup 5a and the second cup 5b in step S212, and positions the robot hand at the delivery position in step S213.

The PLC 102a rotates the chuck pin base 3a to open the chuck pin 3b in step S214, and causes the robot hand to receive the wafer 1 from the chuck stage 2b in step S215.

The PLC 102a causes the robot hand to store the wafer 1 into the carrier in step S216, and rotates the chuck pin base 3a to close the chuck pin 3b in step S217.

Note that, although the steps have been described roughly sequentially for the purpose of simplification, it is needless to say that segmented operation steps are practically in execution in parallel, and various inputs and outputs related to the operations are in execution.

Effect

As described above, in the semiconductor manufacturing apparatus according to the first preferred embodiment, the gas passing through the lower surface gas nozzle 2c can be switched between the temperature-controlled gas 17 and the ambient temperature gas 16 through the actuation of the first on-off valve 11c and the second on-off valve 11d, and it goes without saying that a set temperature of the temperature-controlled gas 17 can be changed in accordance with a recipe, thereby making it possible to change the temperature as desired. For example, in a reaction-controlled chemical liquid process such as removal of a resist with a sulfuric acid/hydrogen peroxide mixture, in order to shorten a processing time, the temperature of the chemical liquid is increased to make reactivity higher in many cases, but it is possible to make the temperature equivalent to the temperature of the chemical liquid and uniform, and it is accordingly possible to perform the chemical liquid process with the temperature uniform all over the wafer 1, which in turn makes it possible to ensure sufficient in-plane uniformity in the chemical liquid process.

Further, in a reaction-controlled chemical liquid process such as etching by a predetermined amount of an oxide film with hydrofluoric acid, the ambient temperature gas 16 that is not temperature-controlled is generally supplied, but, rather than the ambient temperature gas 16 that is not temperature-controlled, the temperature-controlled gas 17 whose temperature has been controlled to a temperature equivalent to the temperature of the chemical liquid controlled to the ambient temperature is supplied, so that it is possible to make the temperature all over the wafer 1 including the center portion of the wafer 1 uniform without being affected by a change in environmental such as the room temperature, and it is accordingly possible to perform the chemical liquid process with the temperature uniform all over the wafer 1, which in turn makes it possible to ensure sufficient in-plane uniformity in the chemical liquid process.

Second Preferred Embodiment

Figure 6:
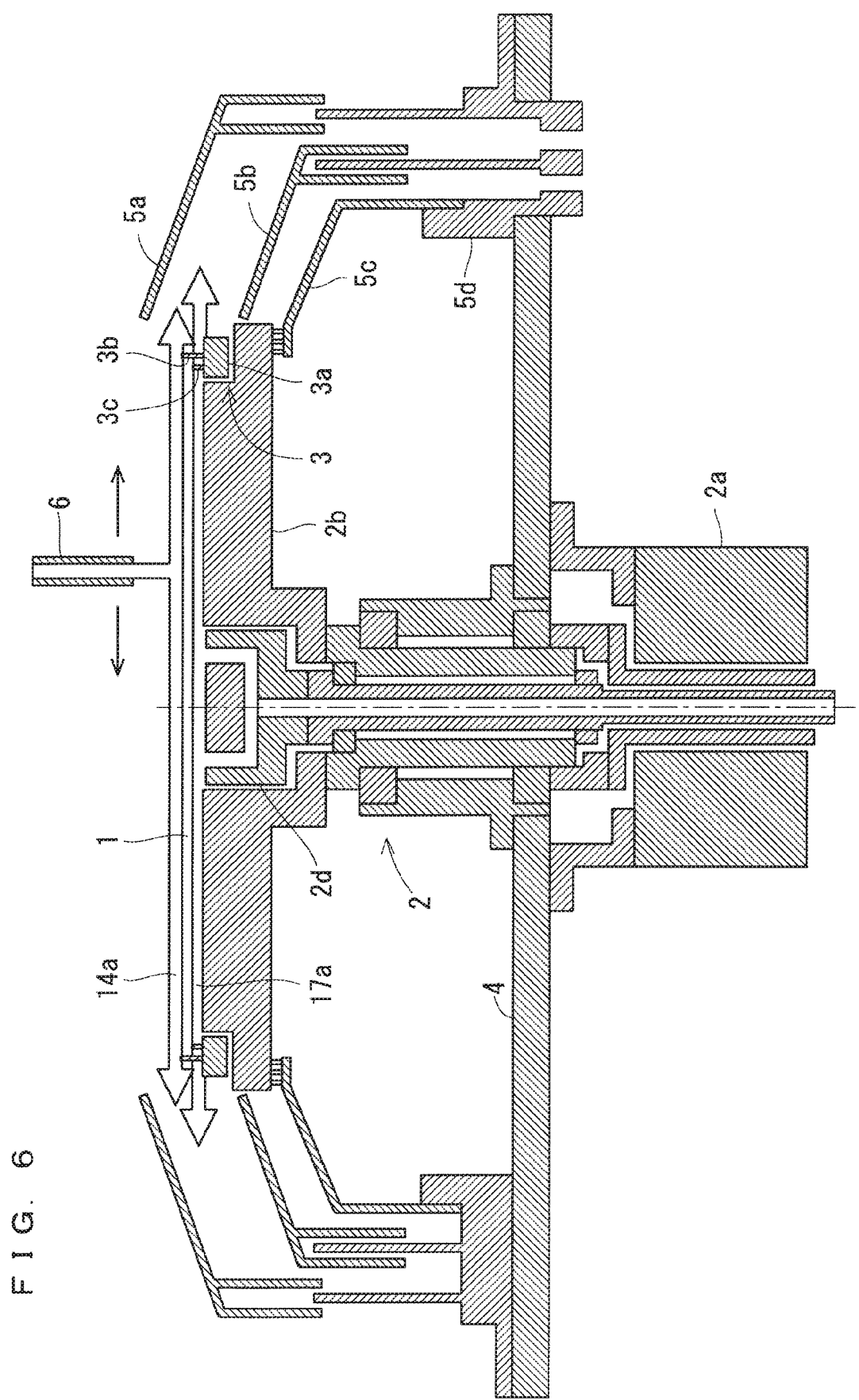
FIG. 6 is a cross-sectional view showing a chemical liquid process in a processing chamber of a semiconductor manufacturing apparatus according to a second preferred embodiment.

Next, a description will be given of a semiconductor manufacturing apparatus according to a second preferred embodiment. FIG. 6 is a cross-sectional view showing a chemical liquid process in a processing chamber of the semiconductor manufacturing apparatus according to the second preferred embodiment. Note that, in the second preferred embodiment, the same components as those described in the first preferred embodiment are denoted by the same reference numerals, and descriptions thereof will be omitted.

As shown in FIG. 6, the semiconductor manufacturing apparatus according to the second preferred embodiment includes a lower surface gas nozzle 2d instead of the lower surface gas nozzle 2c. A discharge port of the lower surface gas nozzle 2d is positioned to surround a center portion of a wafer 1.

The lower surface gas nozzle 2d is different in structure from the lower surface gas nozzle 2c described in the first preferred embodiment whose discharge port is positioned in alignment with the center portion of the wafer 1, and the discharge port is positioned to surround the center portion of the wafer 1, so that it is possible to give rise to, in an area around the center portion of the wafer 1, a reaction appropriate to a reaction that is liable to occur at the center portion of the wafer 1 and is accelerated or decelerated in accordance with the intensity of activity.

Figure 7:
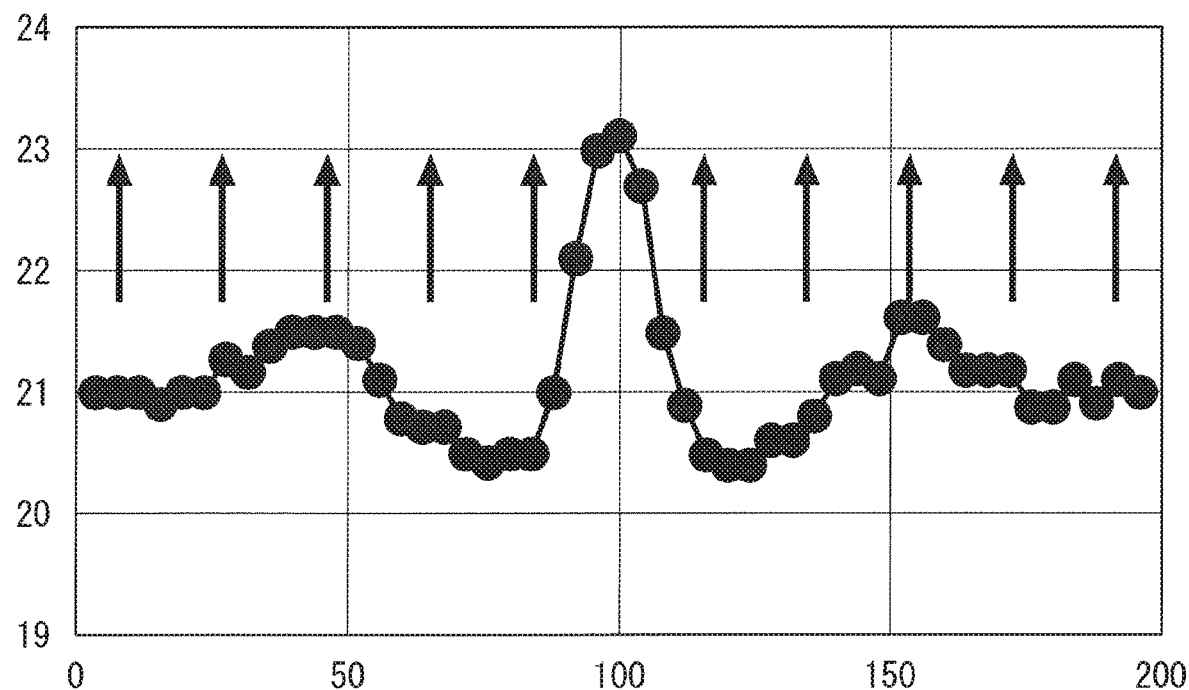
FIG. 7 is a diagram showing an accelerated reaction occurring at a center portion of a wafer when activity is high in the chemical liquid process in which reaction heat is generated.
Figure 8:
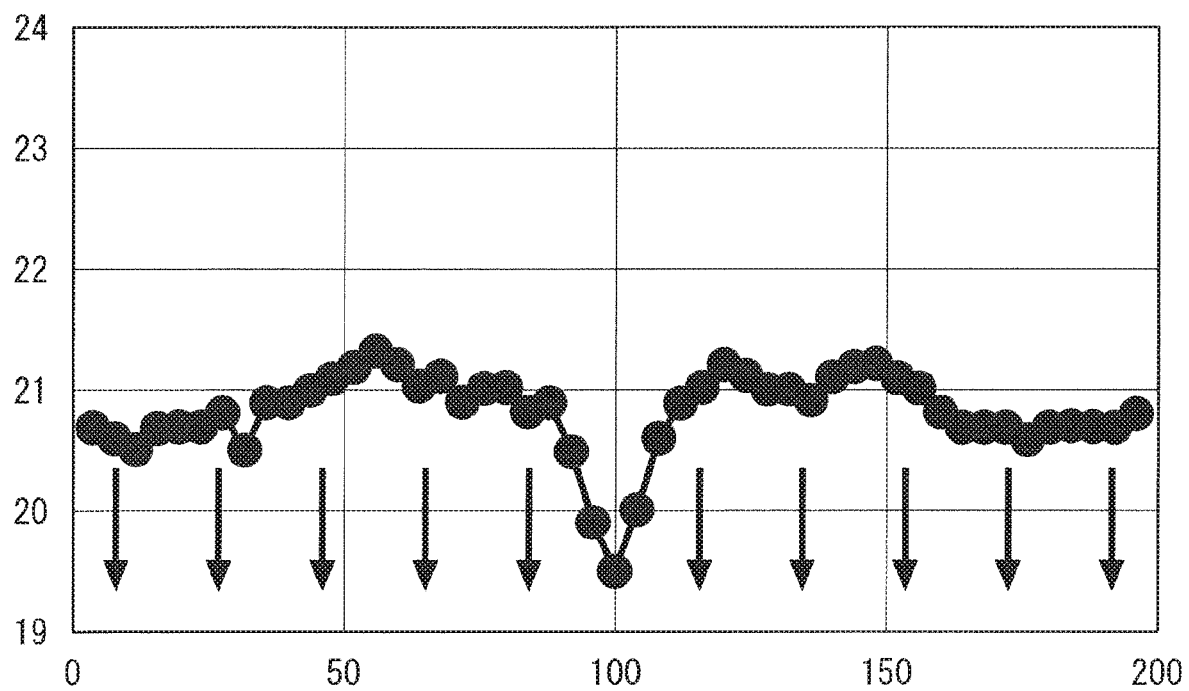
FIG. 8 is a diagram showing a decelerated reaction occurring at the center portion of the wafer when activity is low in the chemical liquid process in which reaction heat is generated.

FIG. 7 is a diagram showing an accelerated reaction occurring at the center portion of the wafer 1 when activity is high in a chemical liquid process in which reaction heat is generated. FIG. 8 is a diagram showing a decelerated reaction occurring at the center portion of the wafer 1 when activity is low in the chemical liquid process in which reaction heat is generated. Note that FIG. 7 and FIG. 8, an axis of ordinate represents an etching amount, and an axis of abscissa represents a position in a radial direction with the center portion of the wafer 1 defined as 100.

As shown in FIG. 7, in order to give rise to, in the area around the center portion of the wafer 1, a reaction appropriate to the accelerated reaction occurring at the center portion of the wafer 1, temperature-controlled gas 17 whose temperature has been controlled by a gas temperature controller 11a to a predetermined temperature higher than a chemical liquid temperature is supplied from the lower surface gas nozzle 2d whose discharge port is positioned to surround the center portion of the wafer 1. As temperature-controlled gas 17a on a lower surface of the wafer 1 increases a temperature in the area around the center portion of the wafer 1, a rate of etching using a chemical liquid 14a on an upper surface of the wafer 1 becomes high, and accordingly the etching amount increases as indicated by the arrows.

Further, as shown in FIG. 8, in order to give rise to, in the area around the center portion of the wafer 1, a reaction appropriate to the decelerated reaction occurring at the center portion of the wafer 1, the temperature-controlled gas 17 whose temperature has been controlled by the gas temperature controller 11a to a predetermined temperature lower than the chemical liquid temperature is supplied from the lower surface gas nozzle 2d whose discharge port is positioned to surround the center portion of the wafer 1. As the temperature-controlled gas 17a on the lower surface of the wafer 1 decreases the temperature in the area around the center portion of the wafer 1, the rate of etching using the chemical liquid 14a on the upper surface of the wafer 1 becomes low, accordingly the etching amount decreases as indicated by the arrows.

Effect

As described above, in the semiconductor manufacturing apparatus according to the second preferred embodiment, the discharge port of the lower surface gas nozzle 2d is positioned to surround the center portion of the wafer 1. This allows the temperature in the area around the center of the wafer 1 to be uniform in a supply-controlled chemical liquid process or the like, and accordingly makes it possible to ensure sufficient in-plane uniformity.

Further, the semiconductor manufacturing apparatuses according to the first and second preferred embodiments have an effect of allowing sufficient in-plane uniformity in the chemical liquid process to be ensured even within the ranges of the operation conditions where their respective physical limits become severe due to, for example, an increase in diameter of the wafer 1, and allowing the processing time to be shortened to further increase a product yield.

Other Modifications

Note that the ambient temperature gas 16 is supplied from the lower surface gas nozzle 2c during the execution of the water washing process in the first preferred embodiment, but in order to perform the water washing process with warm water to increase a substitution effect of the water washing, it is needless to say that it is appropriate to supply the temperature-controlled gas 17 whose temperature has been controlled to a predetermined temperature appropriate to a temperature of the warm water.

Further, the temperature of the temperature-controlled gas 17 supplied from the lower surface gas nozzle 2c during the execution of the chemical liquid process and during the execution of the drying process need not be constant, it is well conceivable that a configuration be employed in which the temperature of gas is changed in accordance with a stage of the process as needed such as changing the temperature during the execution of the process, and it goes without saying that such a configuration lies within the scope of the preferred embodiments of the present invention.

Further, a substance that is a mixture of two types of stock solutions has been given as an example of the chemical liquid, but the present invention is, of course, not limited to such a substance, and as long as a temperature has an effect on the process, any substance such as a mixture of a number of types of stock solutions, an inorganic substance, or an organic substance can be used in the preferred embodiments of the present invention.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor manufacturing method comprising:
    performing a chemical liquid process of causing a chemical liquid to spread all over a processing surface of a semiconductor wafer; and
    performing a temperature control process of changing a temperature of gas to be supplied, wherein
    in the chemical liquid process, the gas whose temperature has been changed in the temperature control process is supplied, through a center of a stage rotation mechanism that supports the semiconductor wafer, to an opposite surface opposed to the processing surface of the semiconductor wafer to heat or cool the semiconductor wafer, and
    the gas whose temperature has been changed is supplied to an area around a center portion of the surface opposed to the processing surface of the semiconductor wafer, without being supplied to the center portion of the surface opposed to the processing surface, to heat or cool the semiconductor wafer except for the center portion of the semiconductor wafer.

2. The semiconductor manufacturing method according to claim 1, further comprising performing a water washing process of washing the processing surface of the semiconductor wafer after the chemical liquid process, wherein
in the water washing process, the gas whose temperature has been changed in the temperature control process is supplied to the opposite surface opposed to the processing surface of the semiconductor wafer to heat or cool the semiconductor wafer.

3. A semiconductor manufacturing method comprising:
performing a chemical liquid process of causing a chemical liquid to spread all over a processing surface of a semiconductor wafer;
after performing the chemical liquid process, performing a washing process of causing water to spread all over the processing surface of the semiconductor wafer; and
performing a temperature control process of changing a temperature of gas to be supplied, wherein
in the chemical liquid process, the gas whose temperature has been changed in the temperature control process is supplied, through a center of a stage rotation mechanism that supports the semiconductor wafer, to an opposite surface opposed to the processing surface of the semiconductor wafer to heat or cool the semiconductor wafer, and
in the washing process, a valve controlling supply of gas having an ambient temperature is opened, so that the gas having an ambient temperature is supplied, through the center of the stage rotation mechanism, to the opposite surface of the semiconductor wafer.

* * * * *